(12) United States Patent
Cheng

(10) Patent No.: US 11,206,733 B2
(45) Date of Patent: Dec. 21, 2021

(54) DISPLAY DEVICE AND BEZEL SUBSTRATE THEREOF

(71) Applicant: WUHAN CHINA STAR OPTOELECTRONICS TECHNOLOGY CO., LTD., Hubei (CN)

(72) Inventor: Yan Cheng, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 441 days.

(21) Appl. No.: 16/471,995

(22) PCT Filed: Mar. 14, 2019

(86) PCT No.: PCT/CN2019/078194
§ 371 (c)(1),
(2) Date: Jun. 20, 2019

(87) PCT Pub. No.: WO2020/118936
PCT Pub. Date: Jun. 18, 2020

(65) Prior Publication Data
US 2021/0360779 A1 Nov. 18, 2021

(30) Foreign Application Priority Data
Dec. 13, 2018 (CN) .......................... 201811526976.7

(51) Int. Cl.
*H05K 1/02* (2006.01)
*H05K 5/00* (2006.01)

(52) U.S. Cl.
CPC ......... *H05K 1/0277* (2013.01); *H05K 5/0017* (2013.01)

(58) Field of Classification Search
CPC ........ H05K 1/189; H05K 1/118; H05K 1/028; H05K 1/0277; H05K 1/147; H05K 5/00217
See application file for complete search history.

(56) References Cited

U.S. PATENT DOCUMENTS

| | | | |
|---|---|---|---|
| 11,026,323 B2* | 6/2021 | Shi | H05K 1/189 |
| 2014/0217373 A1* | 8/2014 | Youn | H05K 1/0281 257/40 |
| 2017/0256599 A1* | 9/2017 | Kim | H01L 27/1218 |
| 2019/0250446 A1 | 8/2019 | Cheng et al. | |

FOREIGN PATENT DOCUMENTS

| | | |
|---|---|---|
| CN | 108445660 A | 8/2018 |
| CN | 108694890 A | 10/2018 |
| CN | 108878482 A | 11/2018 |
| CN | 108899341 A | 11/2018 |
| CN | 208077978 U | 11/2018 |
| JP | 2018106124 A | 7/2018 |

* cited by examiner

*Primary Examiner* — Hoa C Nguyen
*Assistant Examiner* — Amol H Patel

(57) ABSTRACT

A display panel and a bezel substrate thereof are disclosed. The bezel substrate includes a bending section and a plurality of wirings. Each of the wirings includes a first line section and a second line section, the first line section and the second line section are disposed on the bending section, a width of the first line section to each of the wirings is greater than a width of the second line section of the wirings, and the first line sections of the adjacent wirings are staggered with respect to each other.

15 Claims, 4 Drawing Sheets

DISPLAY DEVICE AND BEZEL SUBSTRATE THEREOF

FIELD OF INVENTION

The present disclosure relates to a field of liquid crystal display technologies, and more particularly, to a display panel having a chip on film (COF).

BACKGROUND OF INVENTION

With increasing demands for display devices, appearance requirements of display devices are also getting higher and higher, especially for mobile display devices, such as mobile phones. More and more attention is paid to the display effect of narrow bezels and high screen-to-body ratios, i.e., the smaller the size of a non-display section at a periphery of a display section, the better the display effects.

In order to achieve a higher screen-to-body ratio, a chip-on-film (COF) encapsulation is applied on a glass, i.e., an encapsulation that a chip is bound to a flexible printed circuit (FPC) and is folded over to the back of a display substrate, thereby reducing occupation of a glass substrate and decreasing a lower bezel of a small size display screen module to achieve a narrow bezel. However, when the chip-on-film encapsulation is in an assembled state, one end of the chip-on-film encapsulation is attached on a display panel and is bent so as to mount at the bottom of the display panel. At the same time, a restoring force acts on the chip-on-film encapsulation in a direction opposite to a bending direction of the chip-on-film encapsulation. Therefore, a peeling phenomenon in which a flexible circuit board peels off from a bottom of the display panel may occur over time. Furthermore, metal wirings are prone to breakage during bending. Meanwhile, a radius of a bending section of the chip-on-film encapsulation is greater than a radius of a bending section of a conventional chip-on-glass substrate (COG) display panel so it is not easy to bend. These disadvantages must be overcome in order to achieve an extremely narrow bezel technology for mobile phones. In addition, a temperature used in the chip-on-film encapsulation is high but a flexible circuit board has a greater expansion coefficient which causes the flexible circuit board susceptible to thermal deformation. Therefore, bonding processes of the flexible circuit board have higher requirements.

Therefore, it is necessary to provide a display panel and a bezel substrate thereof to solve the existing problems in the prior art.

Technical Problems

In view of the above, a display panel and a bezel substrate thereof is provided to solve a problem in the prior art that a strong rebound stress is formed in a bending section after a bezel substrate is folded back. The rebound stress causes undesirable phenomena. For example, the bezel substrates of such products often peel off from the display panels.

SUMMARY OF INVENTION

A main object of the present disclosure is to provide a display panel and a bezel substrate thereof. The present disclosure effectively prevents wirings from breakage when being bent for a long time by providing a first line section having a greater width at the bending section. Furthermore, the wirings are intersected to each other, thereby reducing stress concentration when bending, reducing a width of the bending section, and avoiding signal interference. In addition, the wirings may also be a single metal layer so as to reduce a volume of the bending section.

A secondary object of the present disclosure is to provide a display panel and a bezel substrate thereof. The present disclosure provides a plurality of openings between the wirings. When the bezel substrate of a flexible circuit board is bent, the openings are subjected to a tensile force and are enlarged to alleviate stresses received by the bending section and reduce an extrusion force of the wirings. The openings further reduce an area of the bending section of the flexible circuit board, thereby reducing the undesirable phenomenon in which the flexible circuit board peels off from the display panel and hence affecting display quality. The openings also effectively suppress crack propagation on the metal wirings. In addition, when performing chip-on-film encapsulation with a relatively high temperature, the openings overcome the problem that the flexible circuit board is easily deformed by heat due to a large expansion coefficient of the flexible circuit board. Meanwhile, requirements for the bonding processes of the flexible circuit board is decreased, which increase a reliability and durability of the flexible circuit board.

In order to achieve the foregoing objects of the present disclosure, an embodiment of the present disclosure provides a bezel substrate of a display panel, comprising:

a bending section; and a plurality of wirings, wherein each of the wirings comprises a first line section and a second line section, the first line section and the second line section are disposed on the bending section, a width of the first line section to each of the wirings is greater than a width of the second line section of the wirings, and the first line sections of the adjacent wirings are staggered with respect to each other, and the first line sections are zigzag-arranged in a direction that is perpendicular to a direction in which the wirings are extended.

In an embodiment of the present disclosure, the bending section comprises a plurality of openings, and the adjacent openings are staggered with respect to each other.

In an embodiment of the present disclosure, the openings are defined between the wirings, and the openings are defined at a location corresponding to the first line section or the second line section of the wirings.

In an embodiment of the present disclosure, shapes of the openings are selected from the group consisting of circle, semicircle, rectangle, diamond, cone, and combinations thereof.

In an embodiment of the present disclosure, a distance between junctions of the first line sections of the adjacent wirings in the direction that the wirings are extended is from 0.010 mm to 0.020 mm.

In an embodiment of the present disclosure, the bezel substrate comprises a flexible circuit board and a chip that is bound to the flexible circuit board.

Furthermore, another embodiment of the present disclosure further provides a bezel substrate of a display panel, comprising:

a bending section; and a plurality of wirings, wherein each of the wirings comprises a first line section and a second line section, the first line section and the second line section are disposed on the bending section, a width of the first line section to each of the wirings is greater than a width of the second line section of the wirings, and the first line sections of the adjacent wirings are staggered with respect to each other.

In an embodiment of the present disclosure, the bending section comprises a plurality of openings, and the adjacent openings are staggered with respect to each other.

In an embodiment of the present disclosure, the openings are defined between the wirings, and the openings are defined at a location corresponding to the first line section or the second line section of the wirings.

In an embodiment of the present disclosure, shapes of the openings are selected from the group consisting of circle, semicircle, rectangle, diamond, cone, and combinations thereof.

In an embodiment of the present disclosure, a distance between junctions of the first line sections of the adjacent wirings in the direction that the wirings are extended is 0.010 mm to 0.020 mm.

In an embodiment of the present disclosure, the bezel substrate comprises a flexible circuit board and a chip that is bound to the flexible circuit board.

Furthermore, another embodiment of the present disclosure further provides a display panel, comprising:

a display section; and
a non-display section comprising:
a bezel substrate, the bezel substrate comprising:
a bending section, and
a plurality of wirings, wherein each of the wirings comprises a first line section and a second line section, the first line section and the second line section are disposed on the bending section, a width of the first line section to each of the wirings is greater than a width of the second line section of the wirings, and the first line sections of the adjacent wirings are staggered with respect to each other.

In an embodiment of the present disclosure, a distance between junctions of the first line sections of the adjacent wirings in the direction that the wirings are extended is from 0.010 mm to 0.020 mm.

In an embodiment of the present disclosure, the first line sections are zigzag-arranged in a direction that is perpendicular to a direction in which the wirings are extended.

Beneficial Effects

Compared with the existing chip-on-film encapsulation technology in which a strong rebound stress is formed in a bending section after a bezel substrate is folded back. The rebound stress causes undesirable phenomena, for example, the bezel substrates of such products often peel off from the display panels. In addition, cracks of the wirings caused by the chip-on-film encapsulation tend to spread in a direction of vertical wirings. The present disclosure effectively prevents the wirings from breakage when being bent for a long period of time by disposing a first line section having a greater width at the bending section. The wirings are intersected to each other, thereby reducing stress concentration when bending, reducing a width of the bending section, and avoiding signal interference. Therefore, display quality is ensured. Furthermore, the present disclosure provides a plurality of openings between the wirings to alleviate stresses received by the bending section, reduce an extrusion force of the wirings, and reduce an area of the flexible circuit board, thereby reducing the undesirable phenomenon in which the flexible circuit board peels off from the display panel and hence affecting display quality. The openings also effectively suppress crack propagation on the metal wirings. In addition, when performing chip-on-film encapsulation with a relatively high temperature, the openings overcome the problem that the flexible circuit board is easily deformed by heat due to a large expansion coefficient of the flexible circuit board. Meanwhile, requirements for the bonding processes of the flexible circuit board is decreased, which increase a reliability and durability of the flexible circuit board.

DESCRIPTION OF DRAWINGS

The technical solution, as well as beneficial advantages, of the present disclosure will become apparent in the following detailed description of an embodiment of the present disclosure, with reference to the accompanying drawings.

In the drawing.

DETAILED DESCRIPTION OF PREFERRED EMBODIMENTS

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", "side", "surrounding", "center", "horizontal", "transverse", "vertical", "longitudinal", "axial", "radial", "uppermost" or "lowermost", etc., is used with reference to the orientation of the figures being described. Therefore, the directional terminology is used for purposes of illustration and is not intended to limit the present disclosure. In the accompanying figures, units with similar structures are indicated by the same reference numbers.

The terms "comprise", "includes", and their conjugates mean "including but not limited to".

The terms "a", "an" and "at least one of" as used herein include plural references unless the context clearly dictates otherwise. For example, the term "a processing module" or "at least one processing module" may include a plurality of processing modules, including combination thereof.

It is noted that the terms "a plurality of" and "several" as used herein may be selected from two, three, or more unless the context clearly dictates otherwise and "at least one" may be selected from one, two, three, or more unless otherwise indicated.

As used herein with reference to size or value are not intended to be construed as an inflexible limitation to the precise values. On the contrary, unless otherwise indicated, the various sizes are intended to represent the recited numerical values as well as the functionally equivalent ranges thereof. For example, a disclosed size of "0.010 mm" refers to "about 0.010 mm".

The term "bezel substrate" as used herein refers to a substrate located at a bezel of a display panel.

Figure 1:
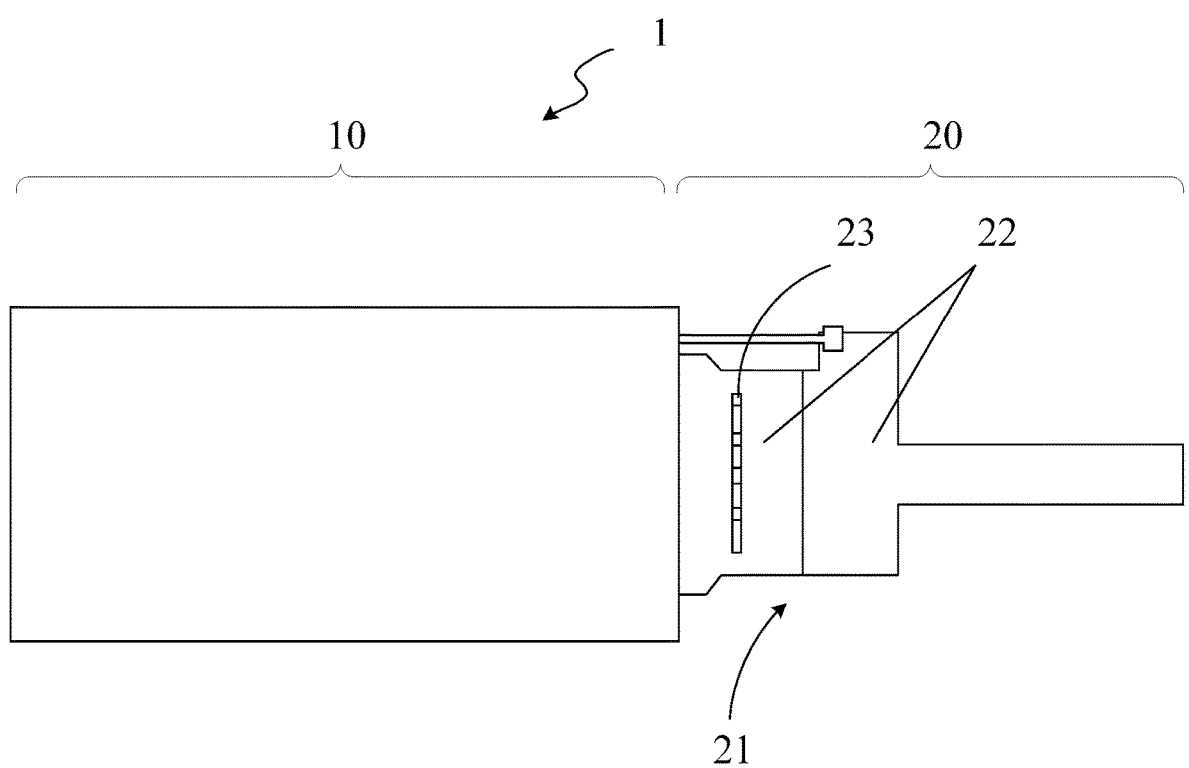
FIG. 1 is a schematic view of a display panel according to an embodiment of the present disclosure.
Figure 2:
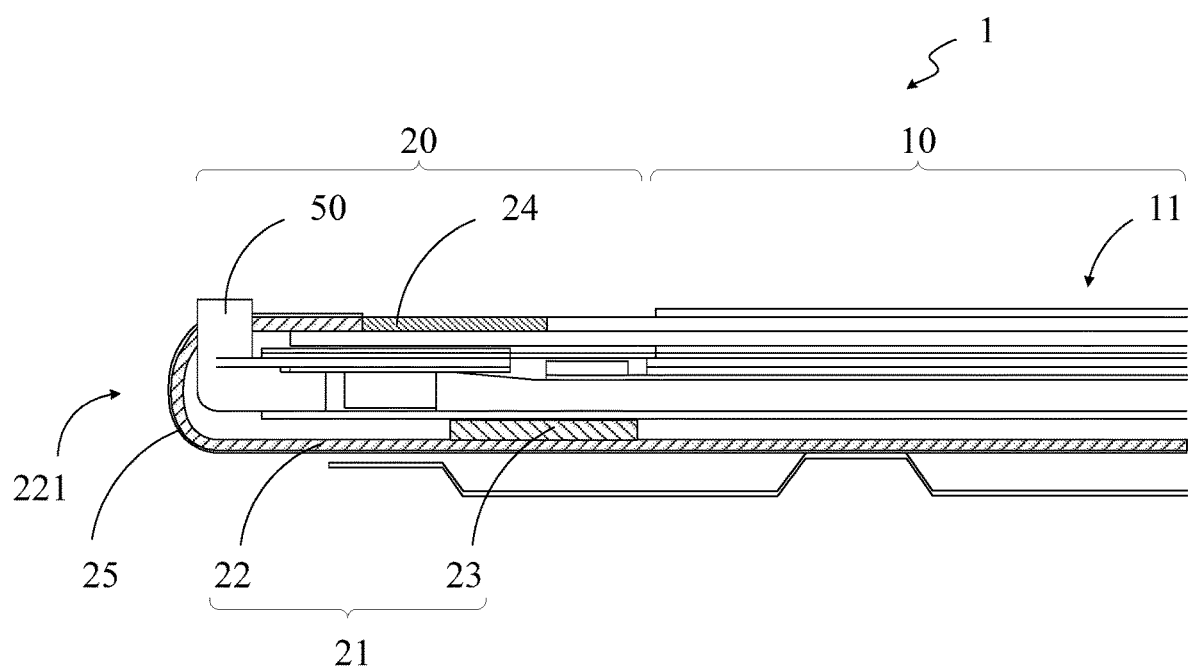
FIG. 2 is a schematic cross-sectional view of a bezel substrate that is folded over to the back of the display panel of FIG. 1 according to an embodiment of the present disclosure.

Please refer to FIG. 1 and FIG. 2. FIG. 1 is a schematic view of a display panel according to an embodiment of the present disclosure and FIG. 2 is a schematic cross-sectional view of a bezel substrate that is folded over to the back of the display panel of FIG. 1 according to an embodiment of the present disclosure. The display panel 1 includes a display section 10 and a non-display section 20. The display section 10 is provided with a display module 11 for receiving a signal to display a picture. The display module 11 can be selected from the group consisting of an organic light emitting diode (OLED) display module, a liquid crystal display (LCD) display module, or a flexible OLED display module. The non-display section is provided with a bezel substrate 21. The bezel substrate 21 includes a flexible circuit board 22. The flexible circuit board 22 is provided with one or more driving chips 23. The flexible circuit board 22 is secured on the non-display section 20 by a bonding section 24.

As shown in FIG. 2, the non-display section 20 further includes a middle frame 50 for fixing the bezel substrate 21. A bending section 221 is defined on the flexible circuit board 22 of the bezel substrate 21. When the bezel substrate 21 is in an assembled state, a first end of the flexible circuit board 22 of the bezel substrate 21 is attached to an upper portion of the display panel 1 by the bonding section 24 in order to further connect to the display section 11 and transmit a signal to the display section 11 for displaying a picture. The bending section 221 is bent such that a second end of the flexible circuit board 22 and the driving chip 23 located on the flexible circuit board 22 are both secured at the bottom of the display panel 1.

Figure 3:
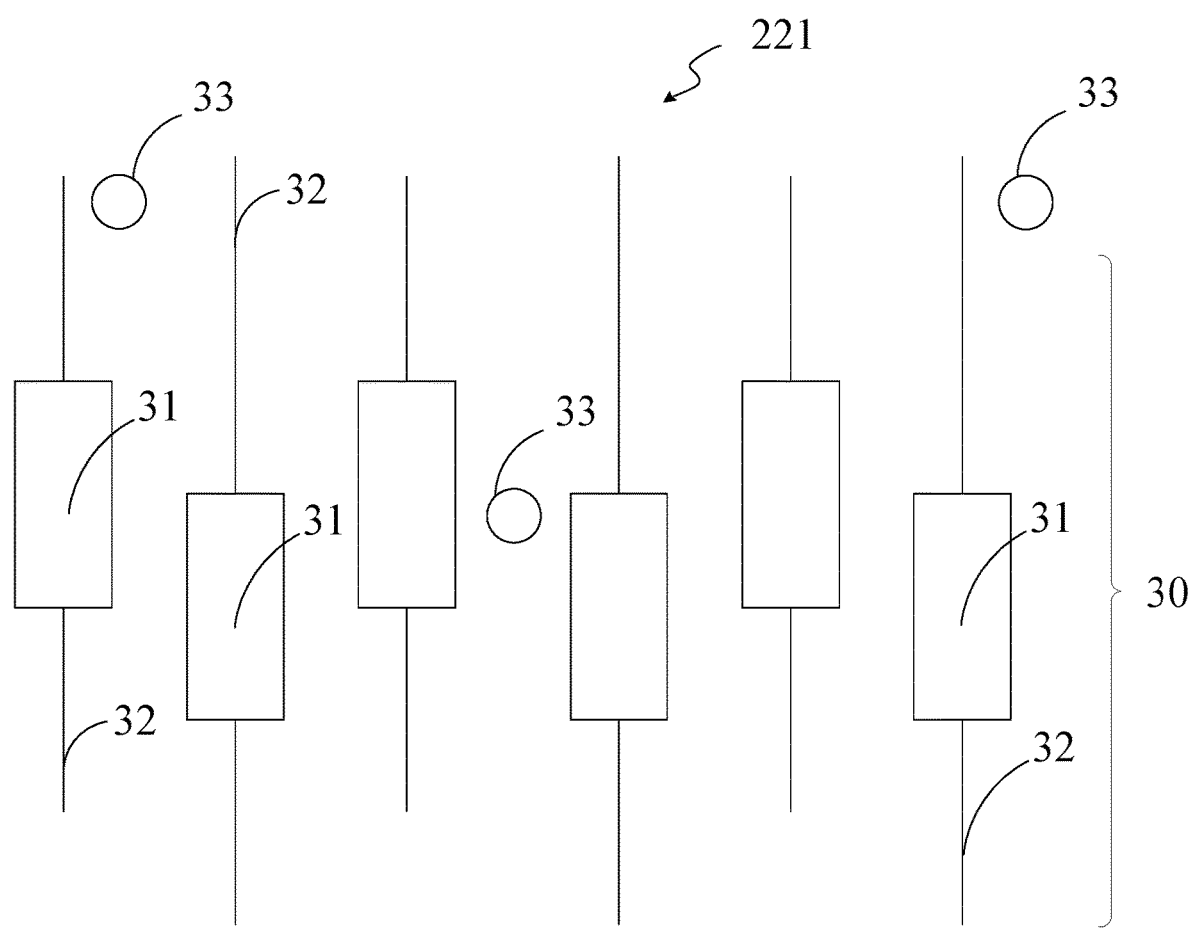
FIG. 3 is a schematic view of a bending section of the bezel substrate of FIG. 2.

Please refer to FIG. 2 and FIG. 3 together. FIG. 3 is a schematic view of a bending section of the bezel substrate of FIG. 2. A plurality of wirings 30 are disposed on the flexible circuit board 22 of the bezel substrate 21. Each of the wirings 30 includes a first line section 31 and a second line section 32. The first line section 31 and the second line section 32 are disposed on the bending section 221. The second line section 32 extends from the flexible circuit board 22 to the bending section 221 in a direction of the wiring 30 and then extends to the display section 11 from the bending section 221.

A width of the first line section 31 of each of the wirings 30 is greater than a width of the second line section 32 of the wirings 30. The first line sections 31 of the adjacent wirings 30 are staggered with respect to each other. In an embodiment of the present disclosure, a distance between junctions of the first line sections 31 of the adjacent wirings 30 in the direction that the wirings 30 are extended is from 0.010 mm to 0.020 mm. In another embodiment of the present disclosure, a distance between junctions of the first line sections 31 of the adjacent wirings 30 in the direction that the wirings 30 are extended is 0.015 mm. In an embodiment of the present disclosure, the first line sections 31 are zigzag-arranged in a direction that is perpendicular to a direction in which the wirings 30 are extended.

The wirings 30 of the present disclosure are provided with the first line section 31 having a greater width at the bending section 221, which effectively prevents the wirings 30 from breakage due to bending for a long period of time. The wirings 30 are intersected to each other, thereby reducing stress concentration when bending, reducing a width of the bending section 221, and avoiding signal interference. Therefore, display quality of the display panel 1 is ensured.

In addition, the wirings 30 may also be a single metal layer so as to reduce a volume of the bending section 221. The wirings 30 may be formed by patterning processes, physical vapor deposition film formations (for example, magnetron sputtering), or wet etching. The above processes are merely illustrative, and the formation of the wirings 30 of the present disclosure is not limited to the above methods.

The photolithography process is one kind of patterning processes, for example, can comprise: preprocessing, base film forming, photoresist coating, baking, exposing, developing, etching, and other steps. For example, the preprocessing commonly includes: wet cleaning, deionized water cleaning, dewatering baking, and other steps; for example, the base film forming can be achieved by using vapor deposition, magnetron sputtering, and other methods; for example, the photoresist coating can be achieved through static adhesive coating or dynamic adhesive coating; the baking can be used for removing a solvent in photoresist or a solvent after the developing. Besides, the photolithography process can also comprise: hardening baking, developing inspection, and other steps. Steps in the photolithography process which are used when a white photoresist layer and a black photoresist layer are formed and the number of times of using the steps are not limited in the description, as long as the white photoresist layer and the black photoresist layer can be formed. For example, the photolithography process can also comprise several of the above steps, for example the photolithography process comprises photoresist coating, the exposing, developing and other steps.

The bezel substrate 21 of the present disclosure may further be provided with a back colloid 25 disposed on a surface of the flexible circuit board 22 to provide long-term protection to the wirings 30.

In an embodiment of the present disclosure, the bending section 221 is further provided with a plurality of openings 33, and the adjacent openings 33 are staggered with respect to each other. The openings may be disposed between the wirings. The openings 33 are defined at a location corresponding to the first line section 31 or the second line section 32 of the wirings 30, in order to avoid an intersection of the first line section 31 and the second line section 32 of each of the wirings 30. Shapes of the openings 33 may be selected from the group consisting of circle, semicircle, rectangle, diamond, cone, and combinations thereof. When the bending section 221 is bent, the openings 33 are subjected to a tensile force and are enlarged to alleviate stresses received by the bending section 221. In addition, when performing chip-on-film encapsulation with a relatively high temperature, the openings 33 overcome the problem that the flexible circuit board 22 is easily deformed by heat due to a large expansion coefficient of the flexible circuit board 22. Meanwhile, requirements for the bonding processes of the flexible circuit board 22 is decreased, which increase reliability and durability of the flexible circuit board 22.

The openings 33 may be formed by various processes, for example, etching or boring by a laser. The above steps are merely illustrative, and the formation of the openings 33 of the present disclosure is not limited to the above methods.

In an embodiment of the present disclosure, each of the openings 33 may be spaced one or more of the wirings 30 apart. As shown in FIG. 3, the openings 33 are spaced two wirings 30 apart.

Figure 4:
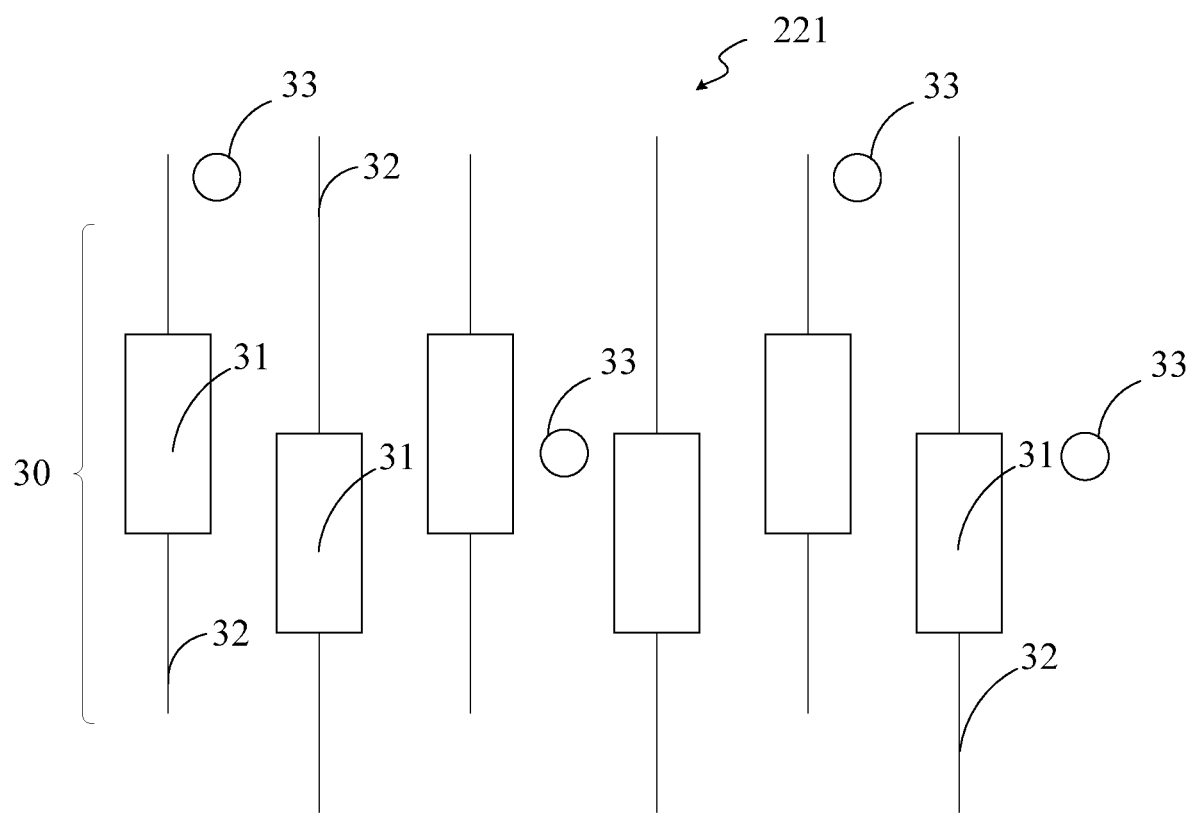
FIG. 4 is a schematic view of a bending section of another embodiment of the bezel substrate of FIG. 2.

Please refer to FIG. 4. FIG. 4 is a schematic view of a bending section of another embodiment of the bezel substrate of FIG. 2. Each of the openings 33 may be spaced one or more of the wirings 30 apart at the same time to effectively release a bending stress and reduce stress concentration when the flexible circuit board 22 is bent. Therefore, the flexible circuit board 22 can be bent more easily.

The present disclosure provides a plurality of openings 33 in the bending section 221 of the flexible circuit board 22 of the bezel substrate 21, which increases the flexibility of the bending section 221 and releases the bending stress, which is beneficial to bending. In addition, the openings 33 are defined at a blank section of the flexible circuit board 22, i.e., the openings 33 are defined between the wirings 30. When the bending section 221 of the flexible circuit board 22 is bent, the openings 33 are subjected to a tensile force and are enlarged to alleviate stresses received by the bending section 221 and reduce the extrusion force received by the wirings 30. In addition, the openings 33 reduce an area of the bending section 221 of the flexible circuit board 22, thereby reducing the undesirable phenomenon in which the flexible circuit board 22 peels off from the display panel 1 and hence affecting display quality.

Because the wirings 30 of the bending section 221 of the present disclosure have different widths in the bending section 221 and the wirings 30 form a double alternating arrangement apart from the openings 33. Furthermore, the openings 33 are defined at a location corresponding to the first line section 31 or the second line section 32 of the wirings 30, in order to avoid an intersection of the first line section 31 and the second line section 32 of each of the wirings 30. Therefore, the openings 33 do not affect a circuit. The openings 33 also reduce a deformation stress and quality caused by the chip-on-film encapsulation and prevent the wirings 30 from breakage. In addition, when performing chip-on-film encapsulation with a relatively high temperature, the openings 33 overcome the problem that the flexible circuit board 22 is easily deformed by heat due to a large expansion coefficient of the flexible circuit board 22. Meanwhile, requirements for the bonding processes of the flexible circuit board 22 is decreased, which increase a reliability and durability of the flexible circuit board 22.

According to various embodiments of the present disclosure, a radius of the actual bending section 221 of the flexible circuit board 22 of the bezel substrate 21 may be reduced to a width of at least 0.1 mm in the direction of the bezel so as to achieve an extremely narrow bezel. Therefore, the bezel substrate 21 of the present disclosure is beneficial to manufacture a lighter and thinner display panel 1.

As described above, compared with the existing chip-on-film encapsulation technology in which a strong rebound stress is formed in a bending section after a bezel substrate is folded back. The rebound stress causes undesirable phenomena, for example, the bezel substrates of such products often peel off from the display panels. In addition, cracks of the wirings caused by the chip-on-film encapsulation tend to spread in a direction of vertical wirings. The present disclosure effectively prevents the wirings 30 from breakage when being bent for a long period of time by disposing a first line section 31 having a greater width at the bending section 221. The wirings 30 are intersected to each other, thereby reducing stress concentration when bending, reducing a width of the bending section 221, and avoiding signal interference. Therefore, display quality of the display panel 1 is ensured.

Furthermore, the present disclosure provides a plurality of openings 33 between the wirings 30. When the bending section 221 of the flexible circuit board 22 is bent, the openings 33 are subjected to a tensile force and are enlarged to alleviate stresses received by the bending section 221 and reduce the extrusion force received by the wirings 30. In addition, the openings 33 reduce an area of the bending section 221 of the flexible circuit board 22, thereby reducing the undesirable phenomenon in which the flexible circuit board 22 peels off from the display panel 1 and hence affecting display quality. The openings 33 also effectively suppress crack propagation on the metal wirings 30. In addition, when performing chip-on-film encapsulation is with a relatively high temperature, the openings 33 overcome the problem that the flexible circuit board is easily deformed by heat due to a large expansion coefficient of the flexible circuit board 22. Meanwhile, requirements for the bonding processes of the flexible circuit board 22 is decreased, which increase reliability and durability of the flexible circuit board 22.

Skilled artisans will appreciate that elements in the figures are illustrated for simplicity and clarity and are not necessarily drawn to scale. That is, the chosen elements are illustrated to enhance an understanding of the functionality and arrangement of features in the various embodiments. Common and well understood elements that may be useful or necessary in a commercially feasible embodiment are not necessarily depicted in order to facilitate a less abstracted view of the embodiments.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable subcombination or as suitable in any other described embodiment of the disclosure. Certain features described in the context of various embodiments are not to be considered essential features of those embodiments, unless the embodiment is inoperative without those elements.

Although the disclosure has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

The invention claimed is:

1. A bezel substrate for a display panel, comprising:
a bending section; and
a plurality of wirings, wherein each of the wirings comprises a first line section and a second line section, the first line section and the second line section are disposed on the bending section, a width of the first line section to each of the wirings is greater than a width of the second line section of the wirings, and the first line sections of the adjacent wirings are staggered with respect to each other, and the first line sections are zigzag-arranged in a direction that is perpendicular to a direction that the wirings are extended along.

2. The bezel substrate of the display panel according to claim 1, wherein the bending section comprises a plurality of openings, and the adjacent openings are staggered with respect to each other.

3. The bezel substrate of the display panel according to claim 2, wherein the openings are defined between the wirings, and the openings are defined at a location corresponding to the first line section or the second line section of the wirings.

4. The bezel substrate of the display panel according to claim 2, wherein shapes of the openings are selected from the group consisting of a circle, a semicircle, a rectangle, a diamond, a cone, and combinations thereof.

5. The bezel substrate of the display panel according to claim 1, wherein a distance between junctions of the first line sections of the adjacent wirings in the direction that the wirings are extended is 0.010 mm to 0.020 mm.

6. The bezel substrate of the display panel of claim 1, wherein the bezel substrate comprises a flexible circuit board and a chip that is bound to the flexible circuit board.

7. A bezel substrate of a display panel, comprising:
a bending section; and a plurality of wirings, wherein each of the wirings comprises a first line section and a second line section, the first line section and the second line section are disposed on the bending section, a width of the first line section to each of the wirings is greater than a width of the second line section of the wirings, and the first line sections of the adjacent wirings are staggered with respect to each other.

8. The bezel substrate of the display panel according to claim 7, wherein the bending section comprises a plurality of openings, and the adjacent openings are staggered with respect to each other.

9. The bezel substrate of the display panel according to claim 8, wherein the openings are defined between the wirings, and the openings are defined at a location corresponding to the first line section or the second line section of the wirings.

10. The bezel substrate of the display panel according to claim 8, wherein shapes of the openings are selected from the group consisting of a circle, a semicircle, a rectangle, a diamond, a cone, and combinations thereof.

11. The bezel substrate of the display panel according to claim 7, wherein a distance between junctions of the first line sections of the adjacent wirings in the direction that the wirings are extended is 0.010 mm to 0.020 mm.

12. The bezel substrate of the display panel according to claim 7, wherein the bezel substrate comprises a flexible circuit board and a chip that is bound to the flexible circuit board.

13. A display panel, comprising:
a display section; and
a non-display section, comprising:
a bezel substrate, the bezel substrate comprising:
a bending section; and
a plurality of wirings, wherein each of the wirings comprises a first line section and a second line section, the first line section and the second line section are disposed on the bending section, a width of the first line section to each of the wirings is greater than a width of the second line section of the wirings, and the first line sections of the adjacent wirings are staggered with respect to each other.

14. The display panel according to claim 13, wherein a distance between junctions of the first line sections of the adjacent wirings in the direction that the wirings are extended is 0.010 mm to 0.020 mm.

15. The display panel according to claim 13, wherein the first line sections are zigzag-arranged in a direction that is perpendicular to a direction that the wirings are extended along.

* * * * *